(12) United States Patent
Kumagai et al.

(10) Patent No.: US 8,449,751 B2
(45) Date of Patent: May 28, 2013

(54) COPPER ELECTROLYTIC SOLUTION CONTAINING AMINE COMPOUND HAVING SPECIFIC SKELETON AND ORGANOSULFUR COMPOUND AS ADDITIVES, AND ELECTROLYTIC COPPER FOIL PRODUCED USING THE SAME

(75) Inventors: Masashi Kumagai, Hitachi (JP); Mikio Hanafusa, Hitachi (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 1059 days.

(21) Appl. No.: 11/906,663

(22) Filed: Oct. 3, 2007

(65) Prior Publication Data

US 2008/0073219 A1    Mar. 27, 2008

Related U.S. Application Data

(62) Division of application No. 11/187,282, filed on Jul. 22, 2005, now Pat. No. 7,378,160, which is a division of application No. 10/479,896, filed as application No. PCT/JP03/06363 on May 21, 2003, now Pat. No. 7,005,055.

(30) Foreign Application Priority Data

Jul. 23, 2002   (JP) ................................. 2002-213889
Oct. 3, 2002    (JP) ................................. 2002-291403

(51) Int. Cl.
*C25D 1/04*    (2006.01)
*C25D 7/06*    (2006.01)

(52) U.S. Cl.
USPC ............................................. 205/77; 205/138

(58) Field of Classification Search
USPC .................................. 205/77, 138, 143, 296
See application file for complete search history.

(56) References Cited

U.S. PATENT DOCUMENTS

| | | | | |
|---|---|---|---|---|
| 4,529,486 | A * | 7/1985 | Polan | 205/77 |
| 5,403,465 | A * | 4/1995 | Apperson et al. | 205/77 |
| 6,800,188 | B2 * | 10/2004 | Hagiwara et al. | 205/296 |
| 2003/0106802 | A1 | 6/2003 | Hagiwara et al. | |

FOREIGN PATENT DOCUMENTS

| | | |
|---|---|---|
| JP | 63-310990 | 12/1988 |
| JP | 02-182890 | 7/1990 |
| JP | 08-053789 | 2/1996 |
| JP | 10-330983 | 12/1998 |

* cited by examiner

*Primary Examiner* — Edna Wong
(74) *Attorney, Agent, or Firm* — Flynn, Thiel, Boutell & Tanis, P.C.

(57) ABSTRACT

The invention has an object of obtaining a low-profile electrolytic copper foil made by electrolytic copper foil manufacturing using a cathode drum such that the surface roughness on the rough surface side (the opposite side to the lustrous surface) is low. In particular, the invention has an object of obtaining an electrolytic copper foil that can be finely patterned and have an excellent elongation and tensile strength at normal and high temperatures. This object is attained by using a copper electrolytic solution containing, as additives, an organosulfur compound, and an amine compound having a specific skeleton obtained by additively reacting an amine compound and a compound having one or more epoxy groups in a molecule thereof to an addition reaction.

2 Claims, 4 Drawing Sheets

COPPER ELECTROLYTIC SOLUTION CONTAINING AMINE COMPOUND HAVING SPECIFIC SKELETON AND ORGANOSULFUR COMPOUND AS ADDITIVES, AND ELECTROLYTIC COPPER FOIL PRODUCED USING THE SAME

This is a division of Ser. No. 11/187,282, filed Jul. 22, 2005, now U.S. Pat. No. 7,378,160, which is a division of Ser. No. 10/479,896, filed Dec. 3, 2003, now U.S. Pat. No. 7,005,055, which was the national stage of International Application No. PCT/JP03/06363, filed May 21, 2003, which International Application was not published in English.

TECHNICAL FIELD

The present invention relates to a copper electrolytic solution used in the manufacture of an electrolytic copper foil, and in particular to a copper electrolytic solution used in the manufacture of an electrolytic copper foil that can be finely patterned and has an excellent elongation and tensile strength at normal and high temperatures.

BACKGROUND ART

In general, to manufacture an electrolytic copper foil, a rotating metal cathode drum having a polished surface and an insoluble metal anode that goes around the periphery of approximately the lower half of the cathode drum are used, and a copper electrolytic solution is made to flow between the cathode drum and the anode. A potential is also applied between the cathode drum and the anode, whereby copper is electrodeposited onto the cathode drum. Once the electrodeposited copper has reached a prescribed thickness, the electrodeposited copper is peeled off from the cathode drum, whereby copper foil is manufactured continuously.

Copper foil obtained in this way is generally referred to as raw foil. This raw foil is subsequently subjected to various surface treatment and is then used in printed wiring boards or the like.

Figure 1:
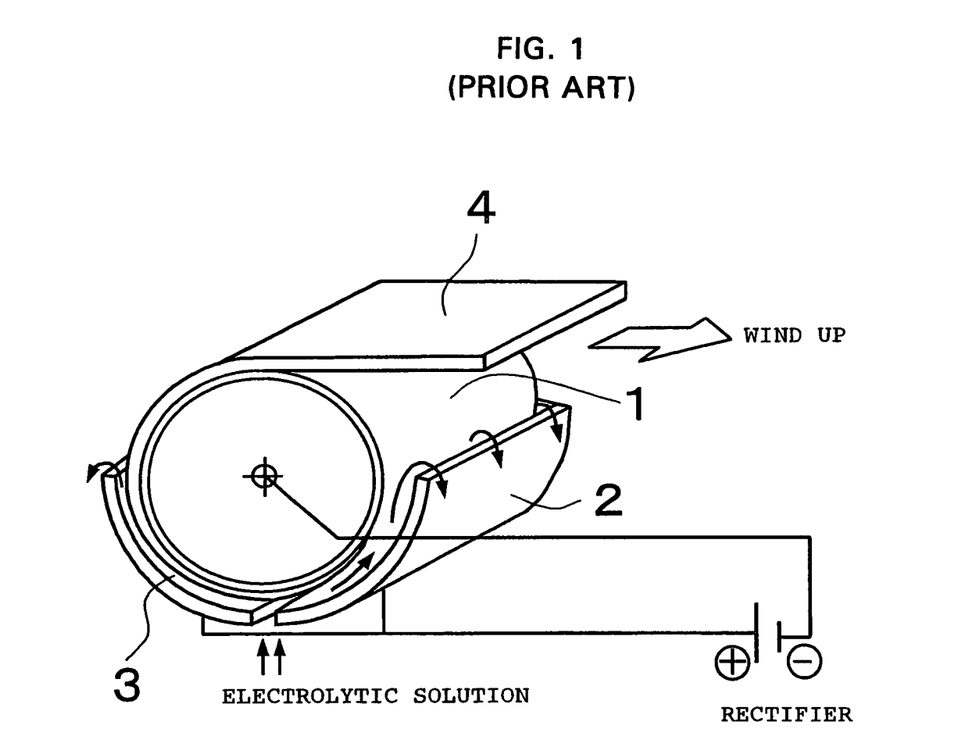
FIG. 1 is a drawing showing an example of an electrolytic copper foil manufacturing apparatus.

A conventional copper foil manufacturing apparatus is shown schematically in FIG. 1. In this electrolytic copper foil apparatus, a cathode drum is installed in an electrolysis bath housing an electrolytic solution. The cathode drum 1 rotates in a state partially submerged (i.e. with approximately the lower half submerged) in the electrolytic solution.

An insoluble anode 2 is provided so as to go around the lower half of the outer periphery of the cathode drum 1. There is a constant gap 3 between the cathode drum 1 and the anode 2, and the electrolytic solution flows through this gap. In the apparatus of FIG. 1, two anode plates are used.

In FIG. 1, the constitution is such that the electrolytic solution is fed in from below, passes through the gap 3 between the cathode drum 1 and the anode 2, and flows over upper edges of the anode 2, thus circulating. A prescribed voltage is maintained between the cathode drum 1 and the anode 2 using a rectifier.

As the cathode drum 1 rotates, the copper electrodeposited from the electrolytic solution grows thicker, and once the copper has become at least a certain thickness, the raw foil 4 is peeled off, and is wound up continuously. The thickness of the raw foil manufactured in this way is adjusted through the distance between the cathode drum 1 and the anode 2, the flow rate of the electrolytic solution fed in, and the amount of electricity fed in.

With copper foil manufactured using such an electrolytic copper foil manufacturing apparatus, the surface contacting the cathode drum becomes a specular surface, but the surface on the other side becomes a rough surface having irregularities. With ordinary electrolysis, the irregularities on the rough surface are severe, and hence there is a problem that undercutting is prone to occurring during etching, and thus fine patterning is difficult.

However, recently, as the density on printed wiring boards has been increased, the circuit width has been reduced and the number of layers has been increased, and accompanying this copper foil that can be finely patterned has come to be required. To carry out fine patterning, copper foil having crystal grains of a uniform size and having a uniform etching rate and a uniform solubility, i.e. copper foil having excellent etching properties, is required.

Moreover, regarding properties required of copper foil for printed wiring boards, not only elongation at normal temperatures, but also elongation at high temperatures are required to prevent cracking due to thermal stress. Furthermore, high tensile strength for dimensional stability of printed wiring boards are required. However, copper foil for which irregularities on the rough surface are severe as above causes a problem of not being suited to fine patterning at all as described above. Studies have thus proceeded into making the rough surface have a low profile.

It is known that, in general, a low profile can be achieved by adding a large amount of animal glue or thiourea to the electrolytic solution. However, such additives have a problem of causing the elongation percentage to drop dramatically at normal and high temperatures, thus causing a great deterioration in the properties as a copper foil for printed wiring boards.

DISCLOSURE OF THE INVENTION

It is an object of the present invention to obtain a low-profile electrolytic copper foil by electrolytic copper foil manufacturing using a cathode drum such that the surface roughness on the rough surface side (the opposite side to the lustrous surface) is low. In particular, it is an object to obtain an electrolytic copper foil that can be finely patterned and has excellent elongation and tensile strength at normal and high temperatures.

The present inventors found that by adding optimum additives to an electrolytic solution, a low profile foil can be formed. Therefore, it is possible to obtain an electrolytic copper foil that can be finely patterned and has excellent elongation and tensile strength at normal and high temperatures.

Based on this finding, the present inventors discovered that, by electrolysis using a copper electrolytic solution containing an amine compound having a specific skeleton and an organosulfur compound, it is possible to obtain an electrolytic copper foil that can be finely patterned and has an excellent elongation and tensile strength at normal and high temperatures. In the case of an electrolytic copper foil manufacturing method in which a copper electrolytic solution is made to flow between a cathode drum and an anode, copper is electrodeposited onto the cathode drum, and the electrodeposited copper is peeled off from the cathode drum to continuously manufacture copper foil. The present invention was thus achieved.

Specifically, the present invention is constituted as follows.

(1) A copper electrolytic solution containing, as additives, an organosulfur compound and an amine compound having a specific skeleton represented by undermentioned general formula (1) obtained by additively reacting an amine compound and a compound having one or more epoxy groups in a molecule thereof.

(1)

(In general formula (1), R1 and R2 are each selected from a group consisting of hydroxyalkyl groups, ether groups, aromatic groups, aromatic-substituted alkyl groups, unsaturated hydrocarbon groups, and alkyl groups, A represents an epoxy compound residue, and n represents an integer greater than or equal to 1.)

(2) A copper electrolytic solution according to (1) above, wherein the epoxy compound residue A of said amine compound having a specific skeleton has a linear ether linkage.

(3) A copper electrolytic solution according to (1) or (2) above, wherein said amine compound having a specific skeleton includes any of undermentioned general formulae (2) to (9).

(6)

(7)

(2)

(3)

(4)

(5)

($n_1$: an integer from 1 to 5)

-continued (8)

($n_2$: an integer from 1 to 22)

(9)

($n_3$: an integer from 1 to 3)

(In general formulae (2) to (9), R1 and R2 are each selected from a group consisting of hydroxyalkyl groups, ether groups, aromatic groups, aromatic-substituted alkyl groups, unsaturated hydrocarbon groups, and alkyl groups.)

(4) A copper electrolytic solution according to (1) above, wherein said organosulfur compound is a compound represented by undermentioned general formula (10) or (11).

(10)

(11)

(In general formulae (10) and (11), $R^1$, $R^2$ and $R^3$ are each an alkylene group having 1 to 8 carbon atoms, $R^4$ is selected from a group consisting of hydrogen,

X is selected from a group consisting of hydrogen, a sulfonic acid group, a phosphonic acid group, and sulfonic acid or phosphonic acid alkali metal salt groups or ammonium salt groups, Y is sulfur or phosphorus, $Z^1$ and $Z^2$ are each hydrogen, sodium or potassium, and n is 2 or 3.)

(5) An electrolytic copper foil produced using the copper electrolytic solution according to any of (1) through (4) above.

(6) A copper-clad laminate using the electrolytic copper foil according to (5) above.

In the present invention, it is important for the electrolytic solution to contain an organosulfur compound, and the amine compound having the specific skeleton represented by above-mentioned general formula (1) that is obtained through an addition reaction between an amine compound and a compound having one or more epoxy groups in a molecule thereof. If only one of these were to be added, then it would not be possible to attain the object of the present invention.

The amine compound (I) having the specific skeleton is synthesized through the addition reaction represented by the undermentioned reaction formula. Specifically, the amine compound having the specific skeleton can be produced by mixing together an amine compound and a compound having one or more epoxy groups in a molecule thereof, and reacting for approximately 30 minutes to 6 hours at 50 to 150° C.

(In the above formula, $R_1$ and $R_2$ are each selected from the set consisting of hydroxyalkyl groups, ether groups, aromatic groups, aromatic-substituted alkyl groups, unsaturated hydrocarbon groups, and alkyl groups, A represents an epoxy residue, and n represents an integer greater than or equal to 1.)

Specific examples of $R_1$ and $R_2$ in the structure of the amine compound having the specific skeleton are a hydroxyethyl group and a hydroxyisopropyl group ('hydroxyalkyl groups' above), a 2-ethoxyethyl group and a 2-propoxyethyl group ('ether groups' above), a phenyl group and a naphthyl group ('aromatic groups' above), a tolyl group, a xylyl group, a cumenyl group and a 1-phenylethyl group ('aromatic-substituted alkyl groups' above), an allyl group, a 1-propenyl group, an isopropenyl group, a 1-butenyl group, a 2-butenyl group and a 2-methylallyl group ('unsaturated hydrocarbon groups' above), and a methyl group, an ethyl group, a propyl group, a butyl group, a pentyl group, a hexyl group, a heptyl group and an octyl group ('alkyl groups' above). From the viewpoint of water-solubility, substituents having too large a number of carbon atoms are not desirable, with it being preferable for the number of carbon atoms per one substituent to be not more than 8.

It is preferable for the amine compound having the specific skeleton to be a compound having a linear ether linkage in the epoxy compound residue A. Compounds having the structural formulae of undermentioned general formulae (2) to (9) are preferable as such compounds in which the epoxy compound residue A has a linear ether linkage, with the epoxy compound residue A in each of general formulae (2) to (9) being as shown below.

(2)

(3)

(4)

(5)

($n_1$: an integer from 1 to 5)

($n_2$: an integer from 1 to 22)

($n_3$: an integer from 1 to 3)

(In general formulae (2) to (9), $R_1$ and $R_2$ are each selected from a group consisting of hydroxyalkyl groups, ether groups, aromatic groups, aromatic-substituted alkyl groups, unsaturated hydrocarbon groups, and alkyl groups.)

Moreover, the organosulfur compound is preferably a compound having a structural formula of above-mentioned general formula (10) or (11).

Examples of organosulfur compounds represented by above-mentioned general formula (10) are as follows, with it being preferable to use these.

$HO_3P-(CH_2)_3-S-S-(CH_2)_3-PO_3H$ $HO_3S-(CH_2)_4-S-S-(CH_2)_4-SO_3H$ $NaO_3S-(CH_2)_3-S-S-(CH_2)_3-SO_3Na$

$HO_3S-(CH_2)_2-S-S-(CH_2)_2-SO_3H$ $CH_3-S-S-CH_2-SO_3H$ $NaO_3S-(CH_2)_3-S-S-S-(CH_2)_3-SO_3Na$ $(CH_3)_2CH-S-S-(CH_2)_2-SO_3H$

Moreover, examples of organosulfur compounds represented by above-mentioned general formula (11) are as follows, with it being preferable to use these.

The weight ratio of the amine compound to the organosulfur compound in the copper electrolytic solution is preferably in a range of 1:5 to 5:1, more preferably 1:2 to 2:1. The concentration of the amine compound in the copper electrolytic solution is preferably in a range of 1 to 50 ppm.

In addition to the amine compound having the specific skeleton and the organosulfur compound described above, publicly known additives, for example polyether compounds such as polyethylene glycol and polypropylene glycol, and, polyethyleneimine, phenazine dyes, animal glue and cellulose may be added into the copper electrolytic solution.

Moreover, a copper-clad laminate obtained by laminating on the electrolytic copper foil of the present invention has an excellent elongation and tensile strength at normal and high temperatures.

BEST MODE FOR CARRYING OUT THE INVENTION

Following is a more detailed description of the present invention, showing examples.

Example of Synthesis of the Amine Compound Having the Specific Skeleton 10.0 g of the epoxy compound represented by the undermentioned chemical formula (Denacol EX-521 made by Nagase Kasei Kogyo K.K.) (0.0544 mol of epoxy groups) and 10.7 g (0.0544 mol) of dibenzylamine were put into a 3-mouth flask, and using a condenser tube with dry ice-methanol as a coolant, the reaction was carried out at 60° C. for 3 hours, thus obtaining an epoxy resin modified with dibenzylamine.

Figure 2:
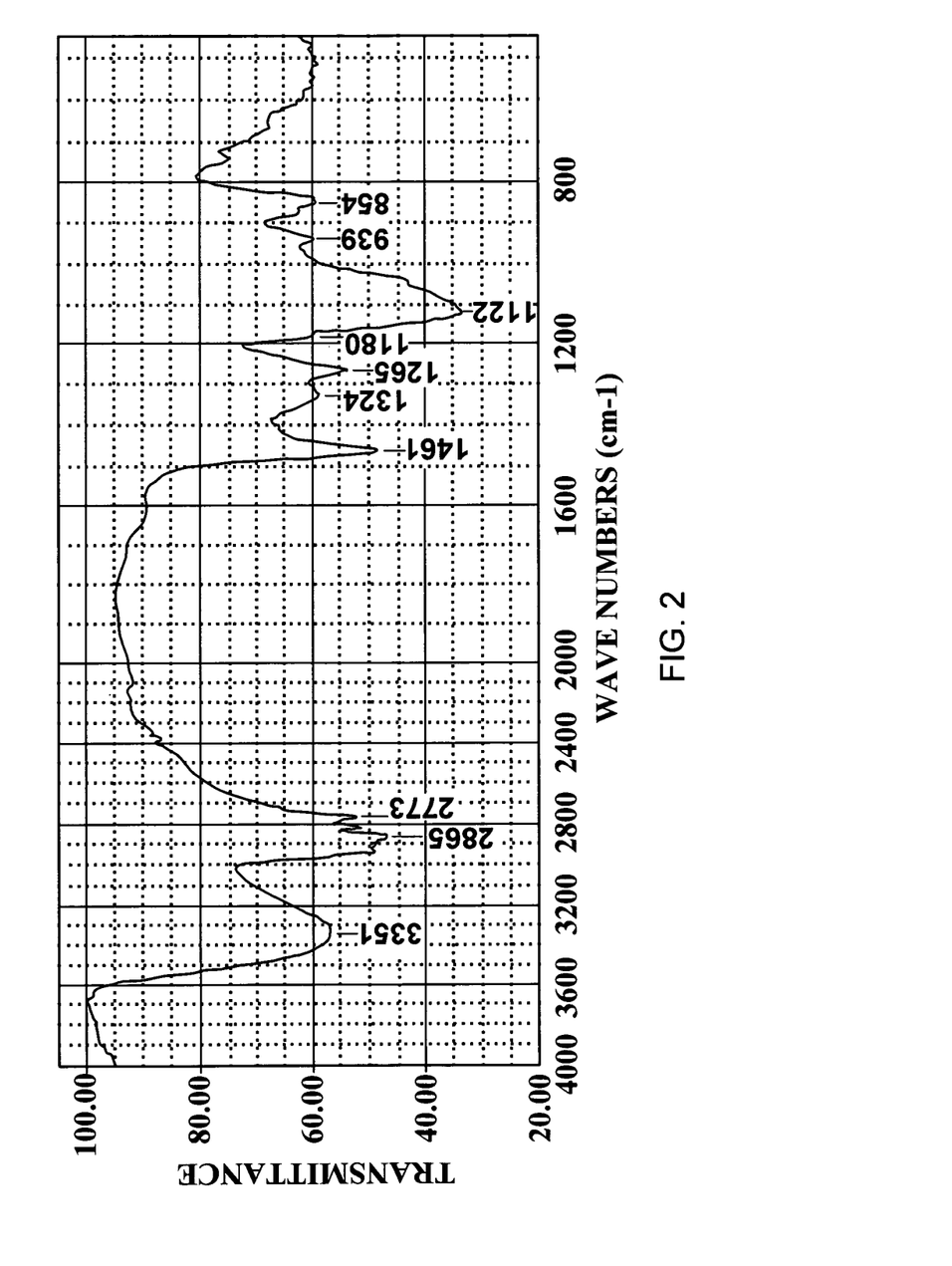
FIG. 2 is the FT-IR spectrum of a dimethylamine compound obtained in an example of synthesis of the amine compound having the specific skeleton.
Figure 3:
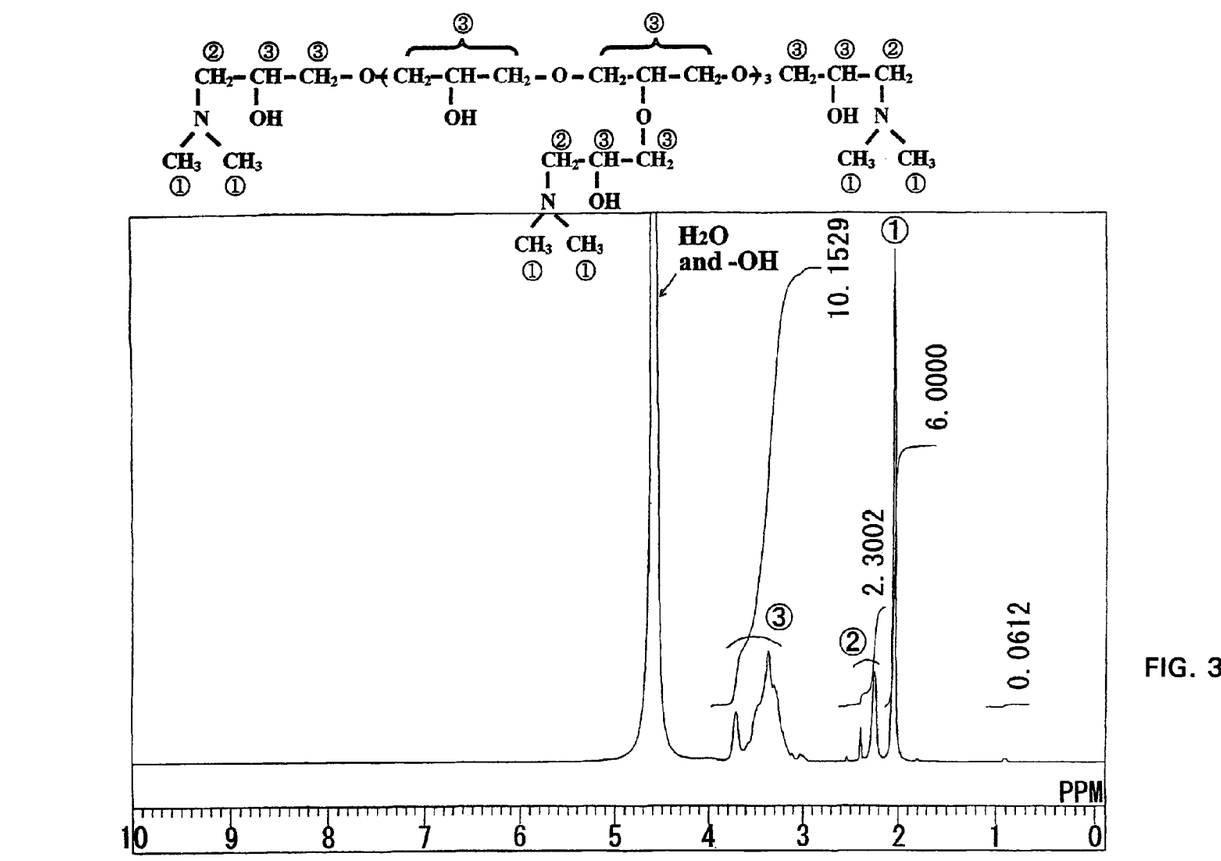
FIG. 3 is the H-NMR spectrum of the dimethylamine compound obtained in the example of synthesis of the amine compound having the specific skeleton.
Figure 4:
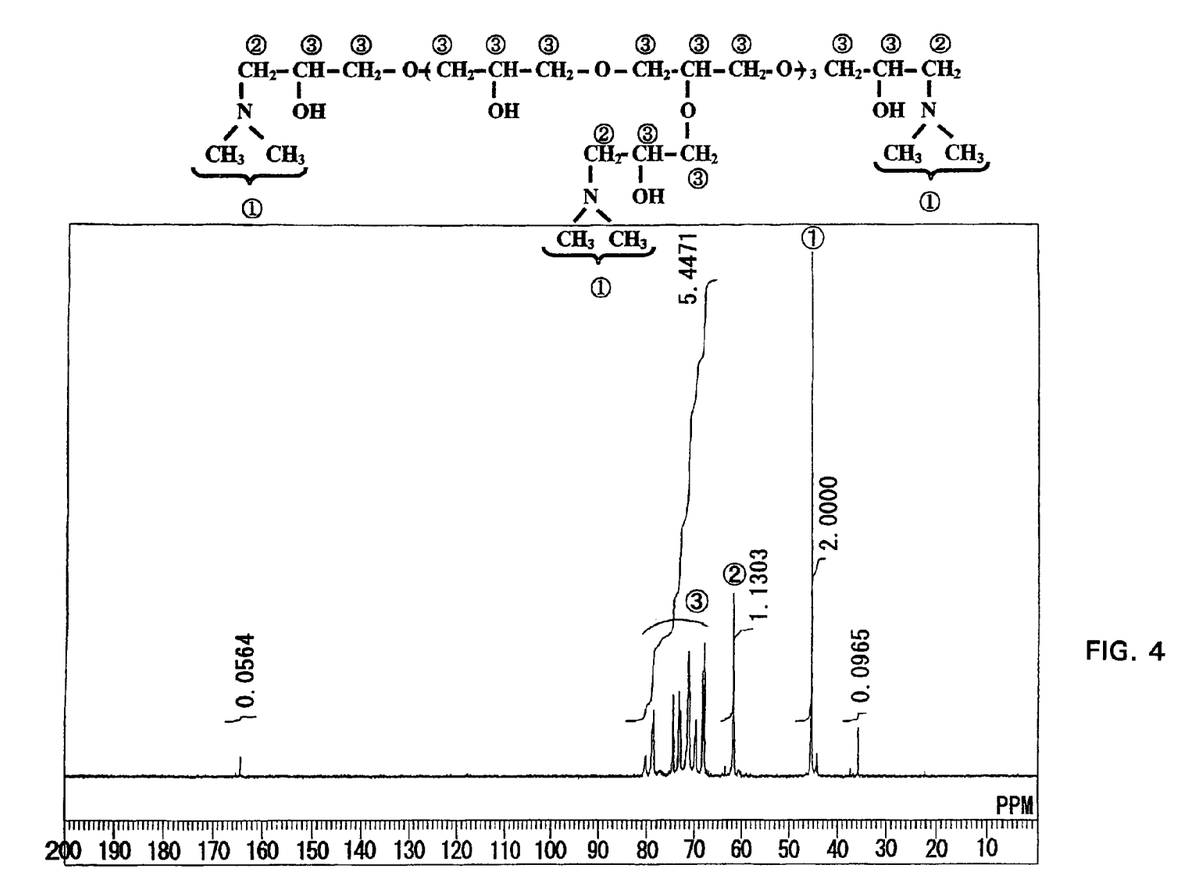
FIG. 4 is the 13C-NMR spectrum of the dimethylamine compound obtained in the example of synthesis of the amine compound having the specific skeleton.

Similarly, epoxy resins modified with each of bis(2-ethoxyethyl)amine, diethanolamine, diphenylamine, diallylamine and dimethylamine were obtained. The FT-IR, 1H-NMR and 13C-NMR spectra of the epoxy resin modified with dimethylamine are shown in FIGS. 2 to 4. The compound obtained was the dimethylamine compound represented by the undermentioned chemical formula.

Examples 1 to 12 and Comparative Examples 1 to 9

35 μm electrolytic copper foil was manufactured using an electrolytic copper foil manufacturing apparatus as shown in FIG. 1. The composition of the electrolytic solution was as follows, with the amounts added of the additives being as shown in Table 1.

| Cu: | 90 g/l |
|---|---|
| H2SO4: | 80 g/l |
| Cl: | 60 ppm |
| Temperature: | 55 to 57° C. |
| Additive A: | Disodium bis(3-sulfopropyl)disulfide (CPS, made by Raschig Inc.) |
| Additive B: | Sodium 3-mercapto-1-propanesulfonate (MPS, made by Raschig Inc.) |
| Additive C: | The amine compound having the specific skeleton obtained in the example of synthesis described above |
| C1: | Dibenzylamine-modified substance |
| C2: | Bis(2-ethoxyethyl)amine-modified substance |
| C3: | Diethanolamine-modified substance |
| C4: | Diphenylamine-modified substance |
| C5: | Diallylamine-modified substance |
| C6: | Dimethylamine-modified substance |

The surface roughness Rz (μm) of each electrolytic copper foil obtained was measured in accordance with JIS B 0601, and the normal-temperature elongation (%), the normal-temperature tensile strength (kgf/mm$^2$), the high-temperature elongation (%) and the high-temperature tensile strength (kgf/mm$^2$) were measured in accordance with IPC-TM650. The results are shown in Table 1.

TABLE 1

| | Additive A (ppm) | Additive B (ppm) | Additive C (ppm) | | | | | | Rz (μm) | Elongation *1 (%) | Tensile strength *1 (kgf/mm$^2$) | Elongation *2 (%) | Tensile strength *2 (kgf/mm$^2$) |
| | | | C1 | C2 | C3 | C4 | C5 | C6 | | | | | |
|---|---|---|---|---|---|---|---|---|---|---|---|---|---|
| Example 1 | 50 | 0 | 50 | 0 | 0 | 0 | 0 | 0 | 1.02 | 8.10 | 32.2 | 13.9 | 21.7 |
| Example 2 | 50 | 0 | 0 | 50 | 0 | 0 | 0 | 0 | 1.00 | 6.62 | 30.5 | 16.2 | 21.0 |
| Example 3 | 50 | 0 | 0 | 0 | 50 | 0 | 0 | 0 | 0.90 | 8.71 | 31.0 | 18.2 | 20.6 |
| Example 4 | 50 | 0 | 0 | 0 | 0 | 50 | 0 | 0 | 1.13 | 8.90 | 37.9 | 12.6 | 20.7 |
| Example 5 | 50 | 0 | 0 | 0 | 0 | 0 | 50 | 0 | 1.15 | 7.12 | 34.2 | 12.1 | 20.1 |
| Example 6 | 50 | 00 | 0 | 0 | 0 | 0 | 0 | 50 | 0.97 | 6.75 | 31.5 | 16.9 | 21.1 |
| Example 7 | 0 | 50 | 50 | 0 | 0 | 0 | 0 | 0 | 1.10 | 8.23 | 32.9 | 14.2 | 20.8 |
| Example 8 | 0 | 50 | 0 | 50 | 0 | 0 | 0 | 0 | 1.02 | 6.69 | 31.2 | 17.0 | 22.3 |
| Example 9 | 0 | 50 | 0 | 0 | 50 | 0 | 0 | 0 | 0.92 | 8.90 | 33.0 | 17.3 | 22.2 |
| Example 10 | 0 | 50 | 0 | 0 | 0 | 50 | 0 | 0 | 1.16 | 8.70 | 36.6 | 12.3 | 21.0 |
| Example 11 | 0 | 50 | 0 | 0 | 0 | 0 | 50 | 0 | 1.20 | 7.23 | 34.9 | 12.4 | 20.3 |
| Example 12 | 0 | 50 | 0 | 0 | 0 | 0 | 0 | 50 | 0.98 | 6.83 | 31.9 | 16.5 | 21.4 |
| Comparative | 0 | 0 | 0 | 0 | 0 | 0 | 0 | 0 | 5.8 | 8.90 | 37.9 | 12.6 | 20.7 |

TABLE 1-continued

| | Additive A (ppm) | Additive B (ppm) | Additive C (ppm) | | | | | | Rz (μm) | Elongation *1 (%) | Tensile strength *1 (kgf/mm²) | Elongation *2 (%) | Tensile strength *2 (kgf/mm²) |
|---|---|---|---|---|---|---|---|---|---|---|---|---|---|
| | | | C1 | C2 | C3 | C4 | C5 | C6 | | | | | |
| Example 1 | | | | | | | | | | | | | |
| Comparative Example 2 | 100 | 0 | 0 | 0 | 0 | 0 | 0 | 0 | 5.3 | 0.2 | 10.3 | 1.0 | 15.3 |
| Comparative Example 3 | 0 | 100 | 0 | 0 | 0 | 0 | 0 | 0 | 6.1 | 0.2 | 11.2 | 1.2 | 14.9 |
| Comparative Example 4 | 0 | 0 | 100 | 0 | 0 | 0 | 0 | 0 | 5.3 | 0.3 | 10.9 | 1.1 | 16.0 |
| Comparative Example 5 | 0 | 0 | 0 | 100 | 0 | 0 | 0 | 0 | 5.8 | 0.1 | 11.1 | 1.0 | 15.8 |
| Comparative Example 6 | 0 | 0 | 0 | 0 | 100 | 0 | 0 | 0 | 5.3 | 0.2 | 12.3 | 1.3 | 15.3 |
| Comparative Example 7 | 0 | 0 | 0 | 0 | 0 | 100 | 0 | 0 | 5.8 | 0.2 | 13.0 | 1.2 | 14.9 |
| Comparative Example 8 | 0 | 0 | 0 | 0 | 0 | 0 | 100 | 0 | 5.2 | 0.2 | 12.2 | 1.1 | 15.9 |
| Comparative Example 9 | 0 | 0 | 0 | 0 | 0 | 0 | 0 | 100 | 4.9 | 0.2 | 10.3 | 2.7 | 12.8 |

*1: at normal temperature
*2: at high temperature

As shown in Table 1 above, for Examples 1 to 12 in which the additives of the present invention (the amine compound having the specific skeleton and the organosulfur compound) were added, each Rz was in a range of 0.90 to 1.20 μm, each normal-temperature elongation was in a range of 6.62 to 8.90%, each normal-temperature tensile strength was in a range of 30.5 to 37.9 kgf/mm², each high-temperature elongation was in a range of 12.1 to 18.2%, and each high-temperature tensile strength was in a range of 20.1 to 22.3 kgf/mm². In this way, even though a remarkably low profile was achieved, the normal-temperature elongation, the normal-temperature tensile strength, the high-temperature elongation and the high-temperature tensile strength all exhibited values similar to or better than those of Comparative Example 1 in which no additives were added. In contrast, for Comparative Example 1 in which no additives were added and Comparative Examples 2 to 9 in which only one of the additives was added, a low profile was not achieved. Moreover, in the cases in which only one of the additives was added, the normal-temperature elongation, the normal-temperature tensile strength, the high-temperature elongation and the high-temperature tensile strength actually became worse.

INDUSTRIAL APPLICABILITY

As described above, the copper electrolytic solution of the present invention to which the amine compound having the specific skeleton and the organosulfur compound have been added is extremely effective in making the rough surface of an electrolytic copper foil obtained have a low profile. Moreover, excellent properties are observed in that extension properties can be maintained effectively not only at normal temperatures but also at high temperatures, and furthermore high tensile strength can similarly be obtained. Moreover, it is understood that addition of both the amine compound having the specific skeleton and the organosulfur compound is important, since only then can the above properties be obtained.

What is claimed is:

1. In a method of producing an electrolytic copper foil for depositing copper on a rotating cathode, the improvement comprising using an electrolytic solution containing copper to be deposited, an organosulfur compound and an amine compound having a specific skeleton represented by any of undermentioned general formulae (2), (6), (7) and (9), which is obtained by additively reacting an amine compound and a compound having one or more epoxy groups in a molecule thereof, (2)

(6)

(7)

(9)

wherein $R_1$ and $R_2$ are each selected from the group consisting of hydroxyalkyl groups, ether groups, aromatic groups, aromatic-substituted alkyl groups, unsaturated hydrocarbon groups and alkyl groups and $n_3$ is an integer of from 1 to 3.

2. A method of producing an electrolytic copper foil according to claim 1, wherein said organosulfur compound is a compound represented by undermentioned general formula (10) or (11), (10)

(11)

$R^1$, $R^2$, and $R^3$ are each an alkylene group having 1 to 8 carbon atoms, $R^4$ is selected from the group consisting of hydrogen, X is selected from the group consisting of hydrogen, a sulfonic acid group, a phosphonic acid group, and sulfonic acid or phosphonic acid alkali metal salt groups or ammonium salt groups, Y is sulfur or phosphorus, $Z^1$ and $Z^2$ are each hydrogen, sodium or potassium, and $n_4$ is 2 or 3.

* * * * *